United States Patent
Fukuda

(10) Patent No.: US 8,908,463 B1
(45) Date of Patent: Dec. 9, 2014

(54) NONVOLATILE SEMICONDUCTOR MEMORY DEVICE AND CONTROL METHOD THEREOF

(71) Applicant: Kabushiki Kaisha Toshiba, Minato-ku (JP)

(72) Inventor: Koichi Fukuda, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/091,554

(22) Filed: Nov. 27, 2013

Related U.S. Application Data

(60) Provisional application No. 61/859,400, filed on Jul. 29, 2013.

(51) Int. Cl.
*G11C 16/32* (2006.01)
*G11C 16/26* (2006.01)
*G11C 16/10* (2006.01)

(52) U.S. Cl.
CPC .............. *G11C 16/10* (2013.01); *G11C 16/26* (2013.01)
USPC ...................... 365/227; 365/185.11; 365/203

(58) Field of Classification Search
USPC ...................... 365/227, 185.11, 203
See application file for complete search history.

(56) References Cited

U.S. PATENT DOCUMENTS

| | | | |
|---|---|---|---|
| 7,701,764 B2 | 4/2010 | Nguyen | |
| 8,203,888 B2 | 6/2012 | Fukuda et al. | |
| 2011/0271040 A1 | 11/2011 | Kamizono | |
| 2012/0063234 A1 | 3/2012 | Shiga et al. | |
| 2012/0140583 A1* | 6/2012 | Chung | 365/191 |
| 2012/0265949 A1 | 10/2012 | Shimizu | |
| 2014/0075233 A1* | 3/2014 | Bartling et al. | 713/324 |

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A semiconductor memory device of this embodiment comprises: a plurality of memory chips each including a plurality of memory cells; and a controller that controls the plurality of memory chips. The controller transmits to any of the plurality of memory chips a drive instruction command instructing an operation. The drive instruction command is transmitted sequentially to the plurality of memory chips with at least a first time interval. Each of the plurality of memory chips, when the memory chip itself is in a standby state of waiting for an instruction for one operation execution of an operation loop for a certain operation, starts the operation of the operation loop in response to the drive instruction command, while when the memory chip itself is in operation execution of the operation loop, ignores the drive instruction command.

12 Claims, 12 Drawing Sheets

US 8,908,463 B1

NONVOLATILE SEMICONDUCTOR MEMORY DEVICE AND CONTROL METHOD THEREOF

CROSS REFERENCE TO RELATED APPLICATIONS

This application is based on and claims the benefit of priority from prior US prior provisional Patent Application No. 61/859,400, filed on Jul. 29, 2013, the entire contents of which are incorporated herein by reference.

FIELD

Embodiments described in the present specification relate to a nonvolatile semiconductor memory device and a control method thereof.

BACKGROUND

A NAND type flash memory is known as a nonvolatile semiconductor memory device that is electrically rewritable and capable of a high degree of integration. Moreover, a memory system configured having a plurality of NAND type flash memory chips (hereinafter, referred to simply as "memory chip") controlled by one controller is also becoming widely used. In such a memory system comprising a plurality of memory chips, it is becoming common that in order to improve system performance, the plurality of memory chips are operated in parallel. In that case, it may occur that a peak current of the plurality of memory chips is concentrated in a certain time period. There is a risk that such a concentration of the peak current causes a drop in a power supply voltage, thereby causing such problems as a system malfunction, and so on.

DETAILED DESCRIPTION

A semiconductor memory device described in an embodiment below comprises: a plurality of memory chips each including a plurality of memory cells; and a controller that controls the plurality of memory chips. The controller transmits to any of the plurality of memory chips a drive instruction command instructing an operation. The drive instruction command is transmitted sequentially to the plurality of memory chips with at least a first time interval. Each of the plurality of memory chips, when the memory chip itself is in a standby state of waiting for an instruction for one operation execution of an operational loop for a certain operation, starts the operation of the operational loop in response to the drive instruction command, while when the memory chip itself is in operation execution of the operation loop, ignores the drive instruction command.

Next, embodiments will be described in detail with reference to the drawings.

First Embodiment

First, a nonvolatile semiconductor memory device according to a first embodiment will be described with reference to FIG. 1, and so on.

[Overall Configuration of System]

Figure 1:
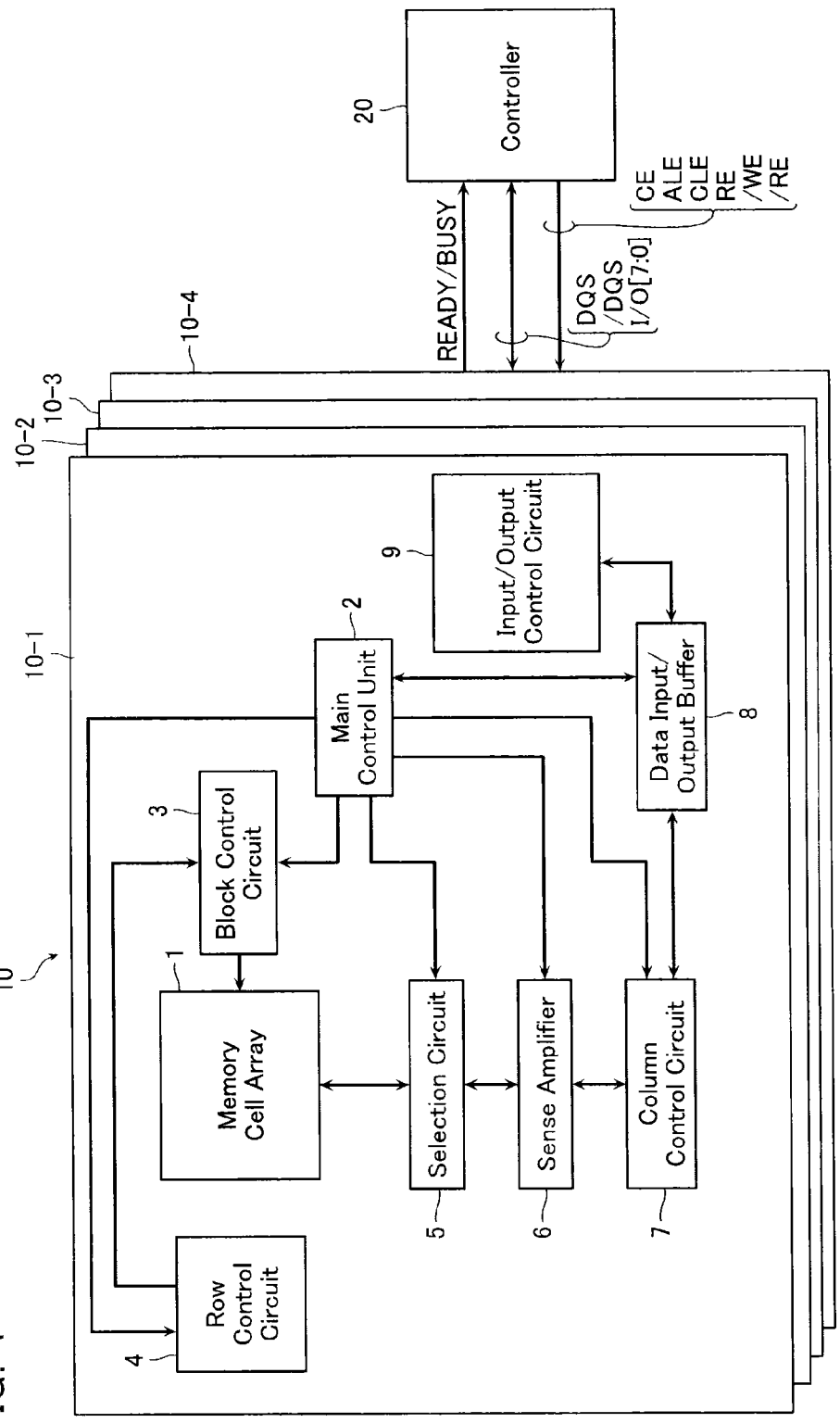
FIG. 1 is a block diagram showing an overall configuration of a memory system acting as a nonvolatile semiconductor memory device.

FIG. 1 is a block diagram showing an overall configuration of a memory system as a nonvolatile semiconductor memory device.

A memory system 10 comprises: a plurality of nonvolatile semiconductor memory chips, for example, four NAND type flash memory chips (hereinafter, memory chip) 10-1, 10-2, 10-3, and 10-4; and a controller 20. The controller 20 controls operation of the memory chips 10-1 to 10-4. In this FIG. 1, the case of four memory chips is given as an example, but this is merely one example, and any other number of memory chips may be set.

Each of the memory chips 10-1 to 10-4 comprises a memory cell array 1, a main control unit 2, a block control circuit 3, a row control circuit 4, a selection circuit 5, a sense amplifier 6, a column control circuit 7, a data input/output buffer 8, and an input/output control circuit 9.

The main control unit 2 receives, via the input/output control circuit 9 and the data input/output buffer 8, a command CMD received from the controller 20. The main control unit 2 controls the block control circuit 3, the row control circuit 4, the selection circuit 5, the sense amplifier 6, and the column control circuit 7 based on this command CMD to control a write operation (programming operation), a read operation, and an erase operation of data to the memory cell array 1.

Moreover, the input/output control circuit 9 transfers data received from the controller 20 to the data input/output buffer 8. Data downloaded to the data input/output buffer 8 is provided to the column control circuit 7.

In addition, the input/output control circuit 9 performs control outputting data read from the memory cell array 1 via the selection circuit 5, the sense amplifier 6, the column control circuit 7, and the data input/output buffer 8 toward the controller 20.

Moreover, the memory chips 10-1 to 10-4 transfer to the controller 20 a signal READY/Busy indicating whether the memory chip itself has finished the write operation, the read operation, or the erase operation, or not.

The block control circuit 3 performs selection of a block included in the memory cell array 1 and control applying a voltage to a word line in the selected block, based on row address data included in address data ADD received from the controller 20. The row control circuit 4 performs control of a voltage applied to a word line in the memory cell array 1 during execution of the write operation, the read operation, and the erase operation of data to the memory cell array 1, based on the row address data included in the address data ADD. The column control circuit 7 controls selection of a bit line in the memory cell array 1 based on a column address included in the address data ADD. The sense amplifier 6 functions to detect and amplify a signal read from a selected bit line and thereby read data held in a memory cell.

[Configuration of Memory Cell Array 1]

Figure 2:
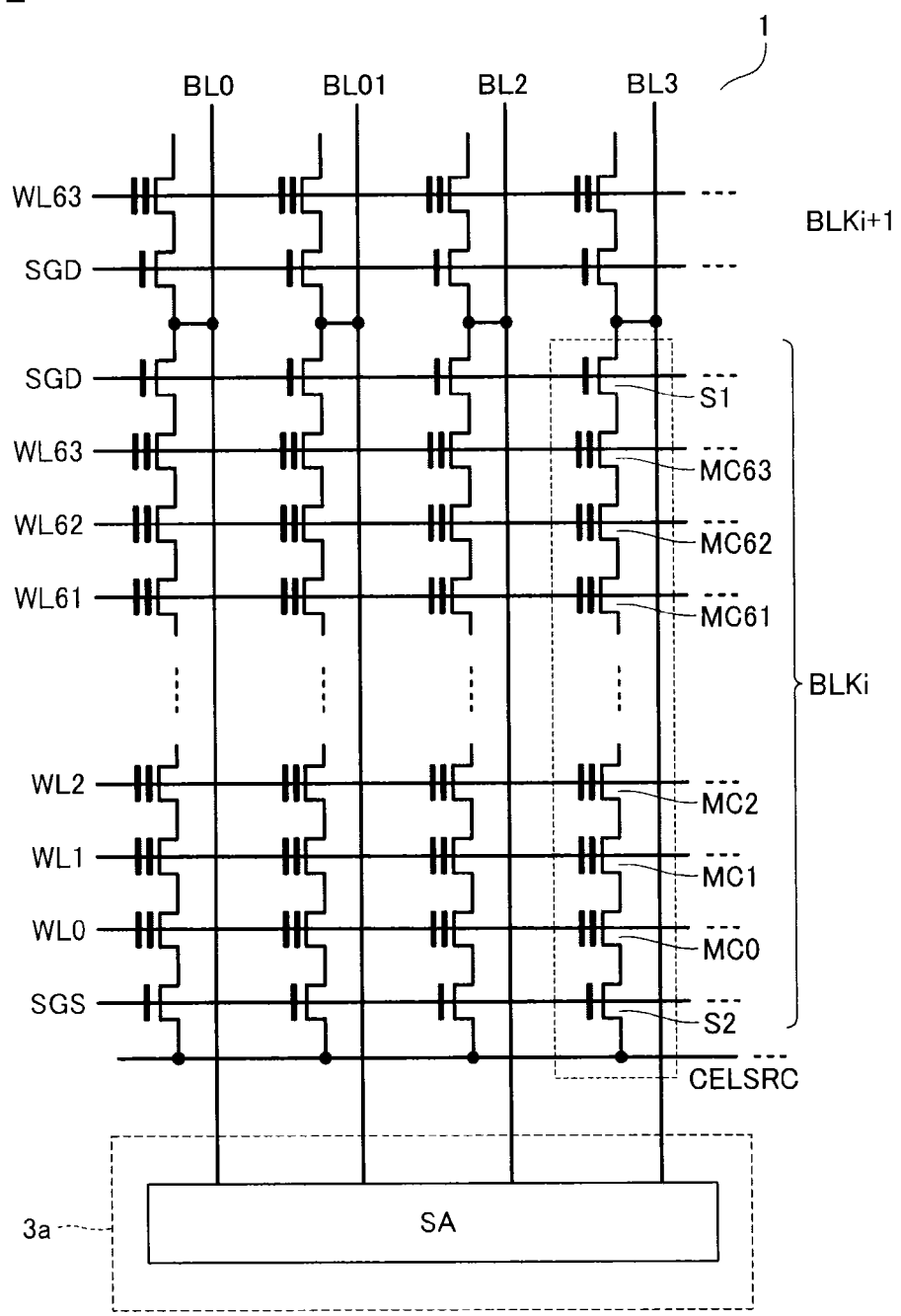
FIG. 2 is a circuit diagram showing a configuration of a block BLKi which is one of a plurality of blocks BLK1-BLKn configuring a memory cell array 1.

The memory cell array 1 comprises a plurality of blocks BLK1-BLKn, each of the blocks BLK1-BLKn having a plurality of NAND cell units NU included therein. FIG. 2 is a circuit diagram showing a configuration of a block BLKi which is one of the plurality of blocks BLK1-BLKn.

One NAND cell unit NU includes: a memory string MS configured having a plurality of (in the illustrated example, 64) electrically rewritable memory cells MC0-MC63 connected in series therein; and select gate transistors S1 and S2 connected to both ends of the memory string MS. A plurality of the NAND cell units NU share a word line WL to form one block BLKi.

One block BLK forms a single unit of a data erase operation. Moreover, when two bits of data are stored in one memory cell MC (two bits per cell), two pages (an upper page UPPER and a lower page LOWER) of data are stored by the memory cells MC formed along one word line WL. If, in one memory cell array 1, the number of word lines WL in one block BLK is, for example, 64, then the number of pages in one block is 64×2=128 pages.

As shown in FIG. 2, one end of the NAND cell unit NU is connected to a bit line BL via the select gate transistor S1, and the other end of the NAND cell unit NU is connected to a common source line CELSRC via the select gate transistor S2. Gates of the select gate transistors S1 and S2 are connected to select gate lines SGD and SGS, respectively. Moreover, control gates of the memory cells MC0-MC63 are connected to word lines WL0-WL63, respectively.

Disposed on a side of one end of the bit line BL is the sense amplifier 6 employed in read and write of cell data, and disposed on a side of one end of the word line WL is the block control circuit 3 that performs selection and drive of the word line and the select gate line.

[Configuration of Memory Cell MC and Select Gates S1 and S2]

Figure 3:
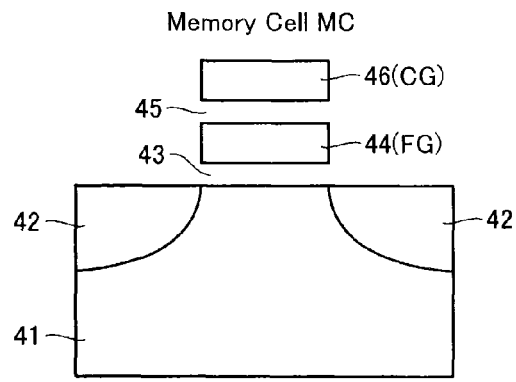
FIG. 3 shows a cross-sectional structure of a memory cell MC.
Figure 4:
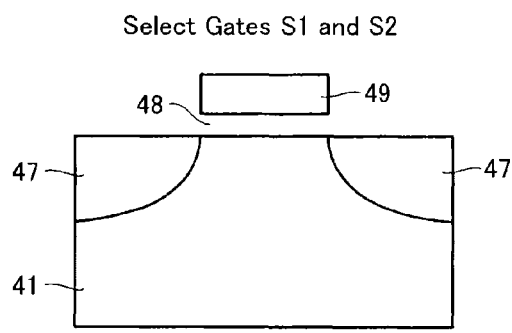
FIG. 4 shows a cross-sectional structure of select gates S1 and S2.

FIGS. 3 and 4 show a cross-sectional structure of the memory cell MC and the select gates S1 and S2. An n type diffusion layer 42 is formed in a substrate 41, the n type diffusion layer 42 functioning as a source and a drain of a MOSFET configuring the memory cell MC. A region sandwiched between two of the n type diffusion layers 42 functions as a channel region. Moreover, a floating gate (FG) 44 is formed on the substrate 41 (channel region) via a gate insulating film 43. The floating gate 44 is configured capable of holding a charge therein, and a threshold voltage of the memory cell MC is determined by an amount of that charge. A control gate (CG) 46 is formed on this floating gate 44 via an inter-gate insulating film 45.

The select gates S1 and S2 comprise: the substrate 41; and an n type diffusion layer 47 formed in this substrate 41 and acting as a source and a drain. A control gate 49 is formed on the substrate 41 via a gate insulating film 48.

[NAND Cell Unit NU]

Figure 5:
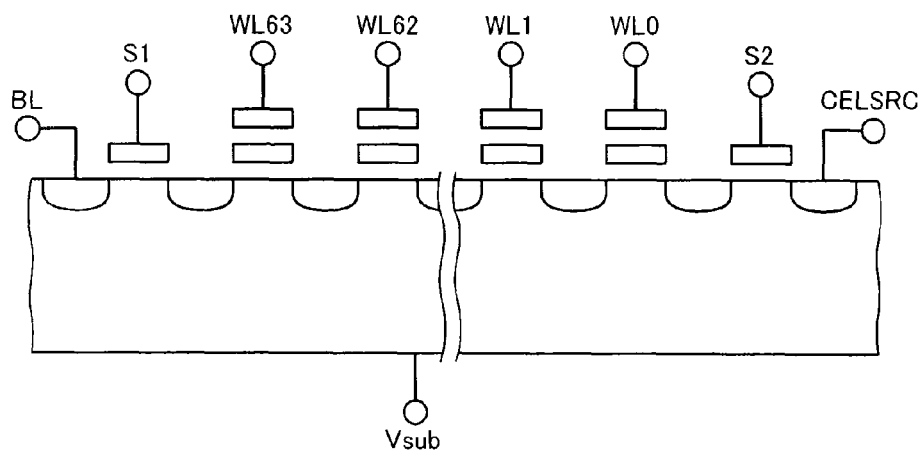
FIG. 5 shows a cross-section of one NAND cell unit NU in the memory cell array 1.

FIG. 5 shows a cross-section of one NAND cell unit NU in the memory cell array 1. In this example, one NAND cell unit NU is configured having 64 memory cells MC of the configuration shown in FIG. 3 connected in series therein. The NAND cell unit NU has its drain side and its source side provided respectively with a first select gate S1 and a second select gate S2 of the configuration shown in FIG. 4.

[Operation]

In the case of a memory system in which a plurality of memory chips 10 are controlled by one controller 20 as in FIG. 1, it may occur that the plurality of memory chips 10 operate simultaneously. In this case, it is required to configure such that a peak of a current (peak current) flowing in the plurality of memory chips 10 does not overlap. For example, an average operation current in a commonly-used NAND flash memory chip is about 20-40 mA, but in a time period of charging a bit line during a write operation, a peak current of about 60-150 mA is generated over a time period of 5-10 µs. In the case of a current detection type sense amplifier, a similar peak current is generated over a time period of 10-30 µs even in a read operation. Therefore, when a plurality of memory chips are operated simultaneously, there is a problem that if the peak currents of the plurality of memory chips overlap, a peak current in the entire system becomes extremely large. For example, in the case that a plurality of memory chips are controlled by one controller, the total current in the system overall may reach about 1 A. There is a risk that such a large current ends up exceeding a supply capability of a power supply IC in the system and that a power supply voltage drops, whereby the system malfunctions.

(Operation in Comparative Example)

Figure 6:
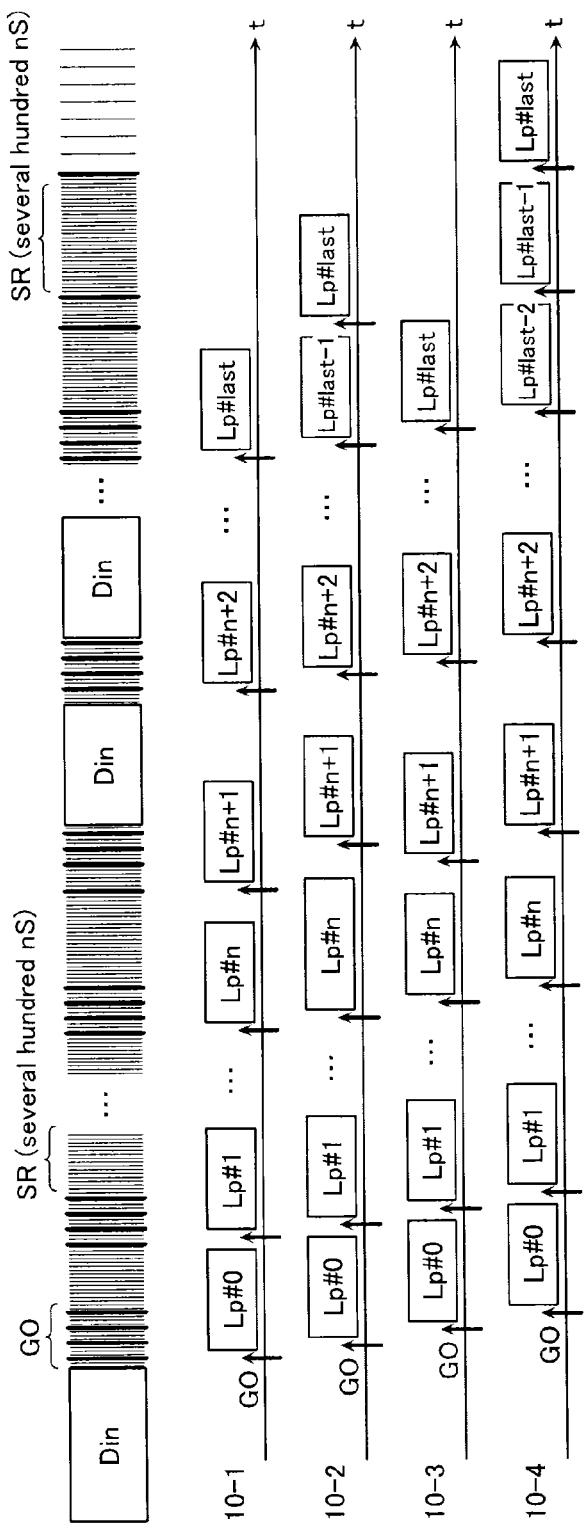
FIG. 6 is a timing chart showing an operation in a comparative example.

In another system (comparative example) for solving such a problem, a controller performs a status read operation for confirming a status of each of chips. As shown in FIG. 6, the controller issues a programming command to each of the memory chips 10-1 to 10-4, and then a status read command SR for the status read operation is transmitted sequentially to any of the plurality of chips at a time interval of, for example, several hundred ns.

Each of the chips 10-1 to 10-4 that have received the status read command SR from the controller sends back a state signal indicating a state of the chip itself, in response to the status read command SR. This state signal includes a signal READY/BUSY indicating whether the programming operation in the memory chip has finished or not. Moreover, this state signal includes, in addition to the signal READY/BUSY, a signal indicating whether the memory chip is executing a write and verify operation of an operational loop Lp as part of the programming operation, or is in a standby state (WAIT) of not executing an operation of the operational loop Lp.

In the case that the signal BUSY is outputted (in the case that the programming operation in the memory chip is not finished), the controller determines, on the basis of the above-mentioned state signal, whether the memory chip is executing an operation of an operational loop Lp configuring part of the programming operation, or is in the standby state (WAIT) of not executing an operation of the operational loop Lp but waiting for an instruction for start of the next operational loop Lp.

If the memory chip is not in the standby state (WAIT) but is in an executing state (NON-WAIT) of being executing an operational loop Lp, the controller transmits the status read command SR toward another memory chip to perform status read on that other memory chip.

If the memory chip is in the standby state (WAIT), the controller transmits, to the memory chip that has been judged as being in a stand-by state, a drive instruction command GO instructing start of the next operational loop Lp. Each of the chips 10-1 to 10-4 starts operation in response to this drive instruction command GO. When the drive instruction command GO is outputted to a certain memory chip, the controller outputs the status read command SR to the next memory chip, and thereafter repeats the above-described operation until the programming operation is completed.

When the signal READY is outputted, the controller does not perform the above-described operation on the memory chip that has outputted the signal READY. The controller performs control such that the drive instruction commands GO to two memory chips are transmitted at an interval of, for example, 10 μs. Thereby, the peak currents of a plurality of memory chips do not overlap.

In the system of this comparative example, the controller not only confirms on the basis of the status read command SR whether each memory chip has finished a certain operation or not (READY or BUSY), but also confirms on the basis of the status read command SR whether each memory chip is in a standby state (WAIT) of not executing an operation of an operational loop configuring part of the certain operation but waiting for an instruction for execution or not. Moreover, the controller first transmits the drive instruction command GO when the standby state has been confirmed. Therefore, the controller is required to continue sequentially transmitting the status read command SR to the plurality of memory chips at a time interval of about several hundred ns. Moreover, upon receiving this status read command SR, each of the memory chips that have received this status read command SR is required to send back to the controller a signal indicating whether the memory chip itself is in the standby state (WAIT) or not. As a result, there is a problem that a bus connecting between the memory chips 10-1 to 10-4 and the controller gets occupied by these status read commands SR or state signals, with the result that operation efficiency of the memory system lowers. In addition, charging and discharging of the bus connecting between the memory chips 10-1 to 10-4 and the controller also causes an increase in power consumption.

(Operation in Present Embodiment)

Figure 7:
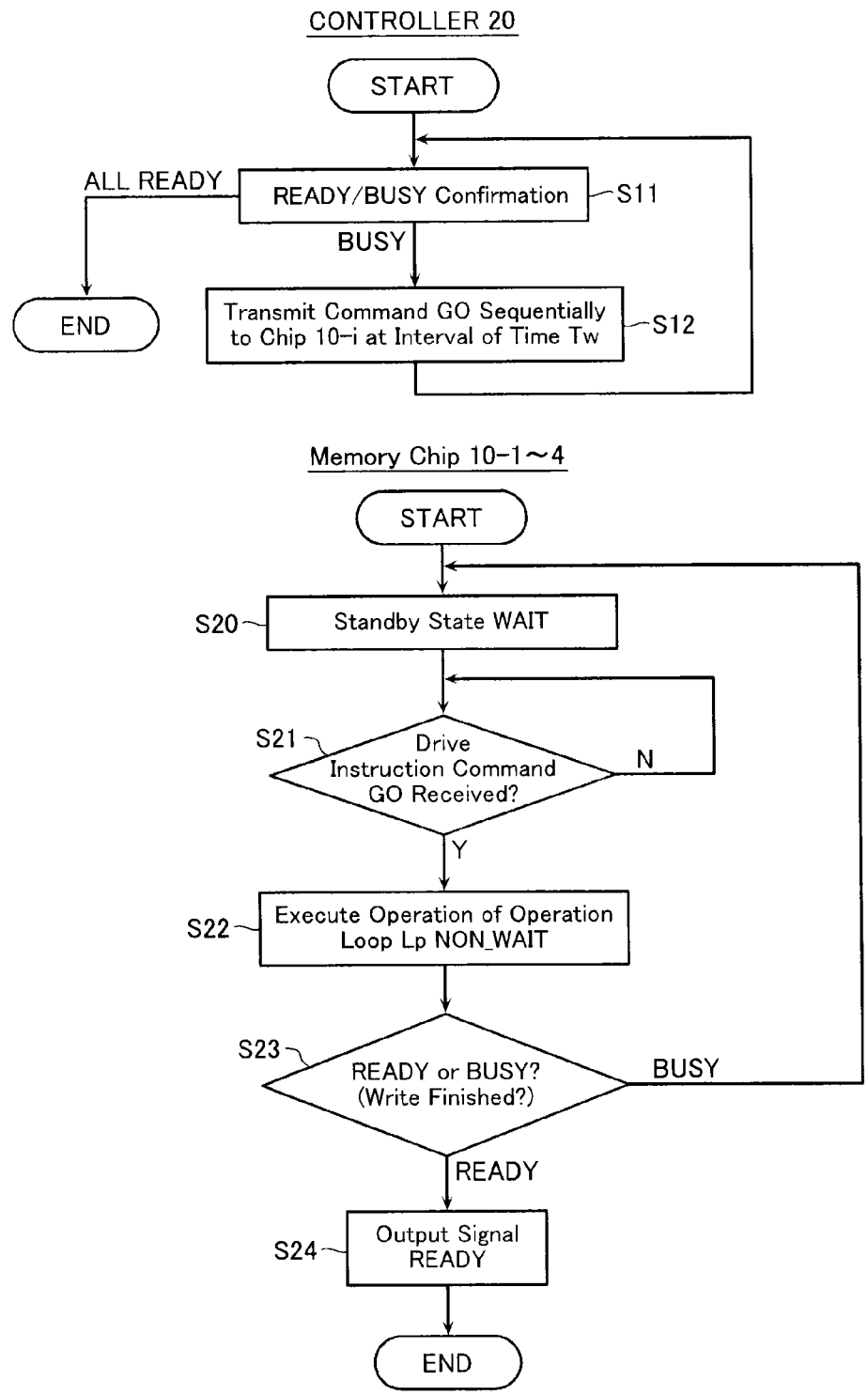
FIG. 7 is a flowchart showing an operation in a first embodiment.
Figure 8:
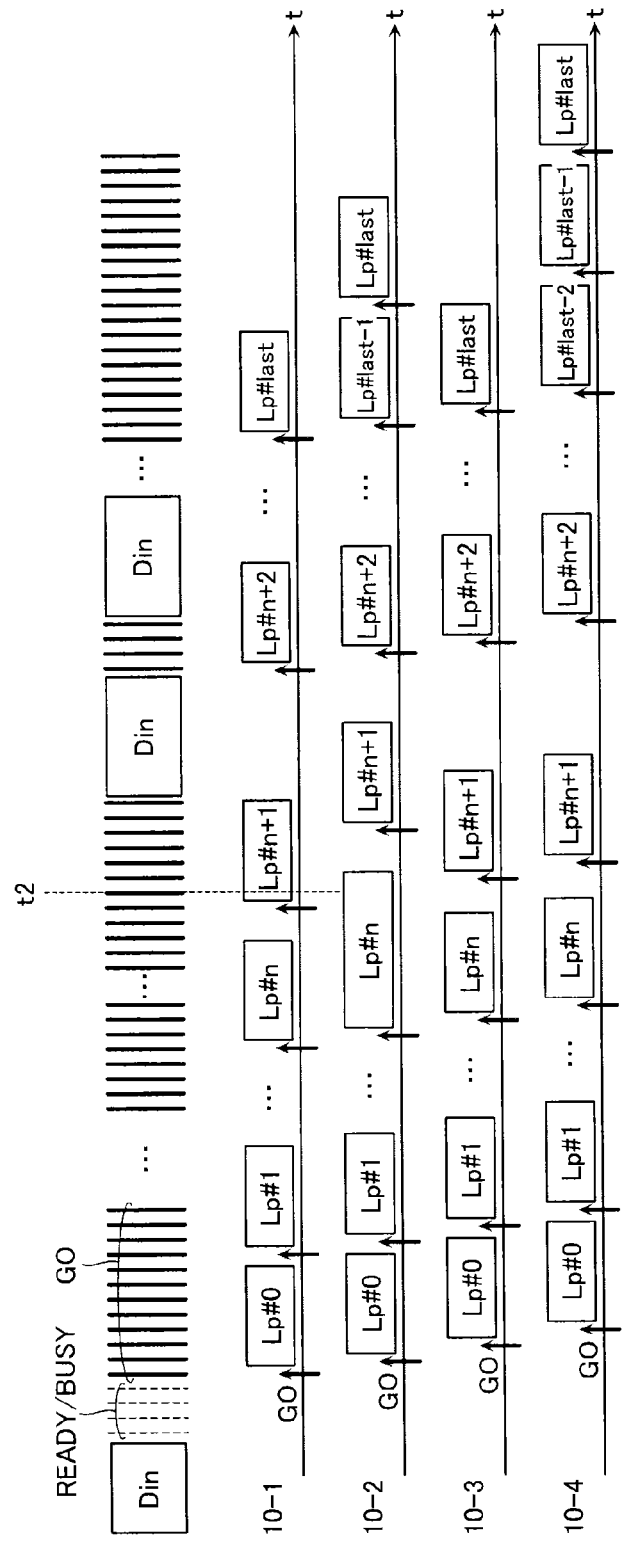
FIG. 8 is a timing chart showing the operation in the first embodiment.

In the present embodiment, as shown in FIGS. 7 and 8, the controller 20 receives from a single READY/BUSY signal shared by the memory chips 10-1 to 10-4 only information related to whether a certain operation of the memory chips 10-1 to 10-4 has been completed or not (READY or BUSY). The memory chips 10-1 to 10-4 do not inform to the controller 20 whether the certain operation has not yet been completed (BUSY), but the memory chip is in the executing state (NON-WAIT) of being executing an operation of an operational loop configuring part of the certain operation, or is in the standby state (WAIT). Instead, on receiving the signal BUSY from any of the memory chips 10-1 to 10-4, the controller 20 outputs the drive instruction command GO sequentially to the memory chips 10-1 to 10-4, with at least a certain time interval (for example, a 5-10 μs interval).

Specifically, when a programming command is issued from the controller 20 toward each of the memory chips 10-1 to 10-4, the memory chips 10-1 to 10-4 that have received the programming command perform a prescribed operation and then shift to the standby state (WAIT).

In this embodiment, a status read command SR is not transmitted for the purpose of confirming whether each of the memory chips 10-1 to 10-4 has finished the write operation (programming operation) or not (READY/BUSY).

When all of the memory chips 10-1 to 10-4 output the signal READY ("ALL READY" of S11 in FIG. 7), the single READY/BUSY signal shared by all of the memory chips 10-1 to 10-4 becomes "H" (READY), whereby the programming operation finishes.

On the other hand, when the signal BUSY has been outputted from any of the memory chips 10-1, 10-2, 10-3, or 10-4 ("BUSY" of S11), the single READY/BUSY signal shared by the memory chips 10-1 to 10-4 becomes "L" (BUSY). The controller 20, after not less than a certain standby time Tw (for example, 5 μs) has elapsed, first outputs the drive instruction command GO to the memory chip 10-1. Then, the controller 20 outputs the drive instruction command GO also to the remaining memory chips 10-2 to 10-4 that have outputted the signal BUSY, with a time increment of at least the standby time Tw (S12 in FIG. 7). In such a manner, the drive instruction command GO is outputted to all of the memory chips 10-1 to 10-4 outputting the signal BUSY, with a time interval Tw.

Each of the memory chips 10-1 to 10-4 that have received the drive instruction command GO does not send back to the controller 20 a signal indicating whether the memory chip itself is in the standby state (WAIT) or is in the executing state (NON-WAIT) of executing an operation of a certain operational loop. When in the standby state (WAIT) (Y of S21 in FIG. 7), each of the memory chips 10-1 to 10-4 starts the operation of the operational loop Lp based on this drive instruction command GO and shifts to the executing state (NON-WAIT) (S22). When the operation of the operation loop Lp is finished (S23), each of the memory chips 10-1 to 10-4 confirms whether the memory chip itself has already finished the programming operation (READY) or has not finished the programming operation (BUSY) (S23), and, if the memory chip has finished the programming operation, outputs the signal READY (S24).

When the memory chip has not finished the programming operation (BUSY of S23 in FIG. 7), that memory chip returns to the standby state (WAIT) (S20 in FIG. 7). On the other hand, when the memory chip itself is in the executing state (NON-WAIT), each of the memory chips 10-1 to 10-4 ignores the drive instruction command GO even when the drive instruction command GO is received, and uninterruptedly continues the operational loop Lp which is in the middle of execution (S22 in FIG. 7). A signal indicating that the drive instruction command GO has been ignored is not sent back to the controller 20. The controller 20 transmits the drive instruction commands GO with the certain time interval Tw, hence operation timing of each of the memory chips is staggered by at least Tw. Therefore, there is no need for the controller to know whether the drive instruction command GO has been ignored or not.

For example, at time t2 in FIG. 8, the memory chip 10-2 is still in the middle of execution of an operation loop Lp#n, hence the drive instruction command GO is ignored. The memory chip 10-2 finishes the operational loop Lp#n and then returns again to the standby state (WAIT). In the case of receiving the drive instruction command GO again in the standby state (WAIT), the memory chip 10-3 starts a new operational loop Lp#n+1.

A transmission interval Tw of the drive instruction commands GO is set to a time interval at least sufficient to prevent the peak current of each of the memory chips 10-1 to 10-4 from overlapping, for example, is set to Tw=5-10 μs. Performing such an operation leads to a reduction in the possibility of the peak current in the plurality of memory chips 10-1 to 10-4 overlapping, and as a result enables power consumption in the memory system overall to be reduced. Moreover, the transmission interval Tw of the drive instruction command GO, being 5-10 μs, is longer compared to the transmission interval of the status read command SR in the comparative example. In addition, each of the memory chips 10-1 to 10-4 does not transmit a response signal to the drive instruction command GO toward the controller 20, but if the memory chip itself is in the executing state (NON-WAIT), simply ignores the drive instruction command GO. Therefore, a situation does not arise that the bus between the controller 20 and the memory chips 10-1 to 10-4 is occupied by various kinds of signals. Hence, this embodiment allows operation efficiency of the memory system to be improved and also power consumption to be suppressed.

Figure 9:
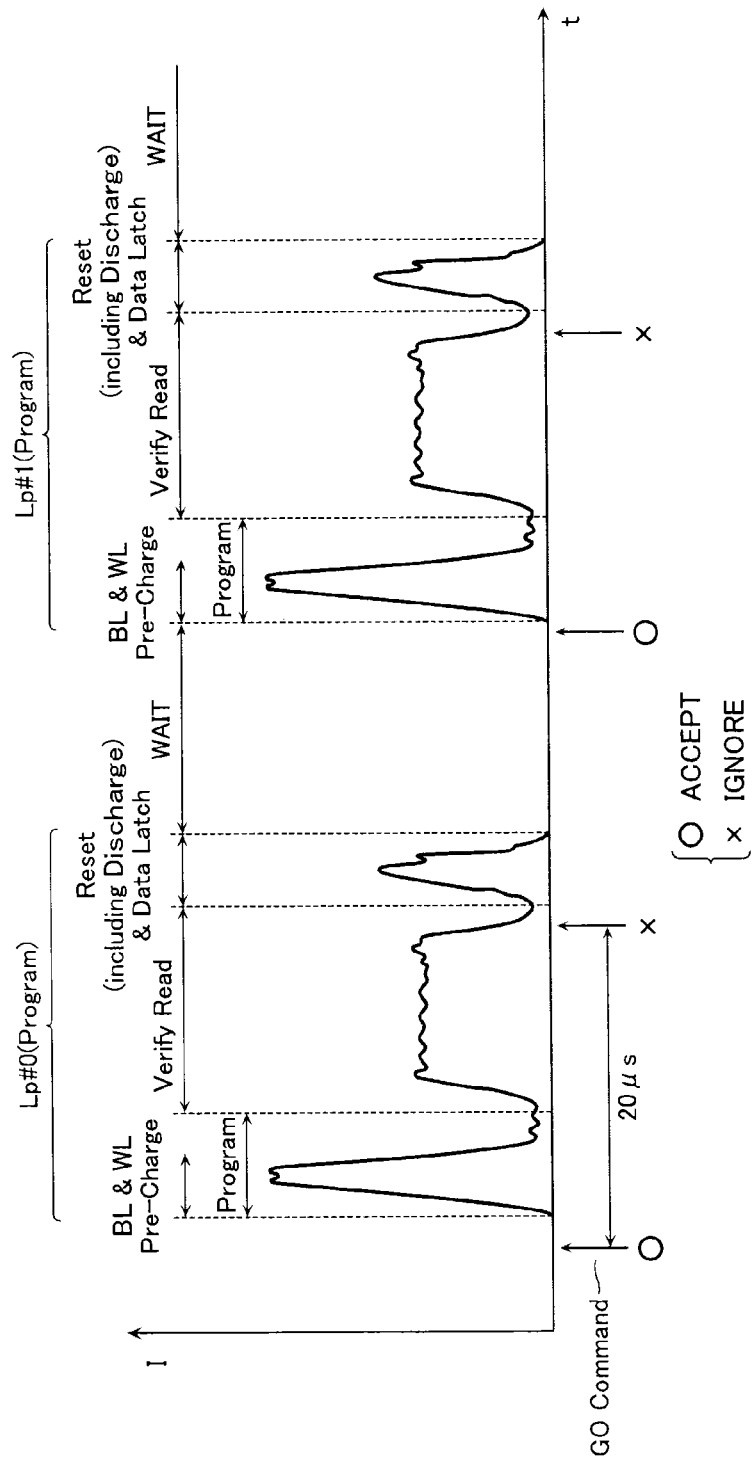
FIG. 9 shows an example of one operational loop Lp in a programming operation.

FIG. 9 shows an example of one operational loop Lp during the programming operation. In the case of the programming operation, one operational loop Lp includes: a programming operation that includes a pre-charge operation that charges the bit line BL and the word line WL; a verify read operation that confirms whether the memory cell has been written to a certain level; and a data latch operation that includes a determining operation of whether the write operation has finished. In the middle of execution of this operational loop Lp, the memory chips 10-1 to 10-4 are in the executing state (NON-WAIT), and, even if they receive the drive instruction command GO, ignore this and uninterruptedly continue the operational loop Lp which is in the middle of execution. When the operation loop Lp finishes, each of the memory chips 10-1 to 10-4 returns to the standby state (WAIT). In the programming operation, the peak current becomes largest in the pre-charge operation. Therefore, the operational loop is stopped immediately before this pre-charge operation. This is preferable for control of avoiding overlap of the peak currents in the programming operation. That is, it is preferable that immediately before the pre-charge operation where the peak current is large, each of the memory chips is shifted to the standby state (WAIT), and that the operational loop Lp is started based on drive instruction commands GO transmitted with at least the time interval Tw (5-20 μs). Such an operation setting makes it possible to avoid the pre-charge operation where the peak current is large from being executed simultaneously in a plurality of memory chips, and thereby enables increase in the peak current for the device overall to be suppressed.

Second Embodiment

Figure 10A:
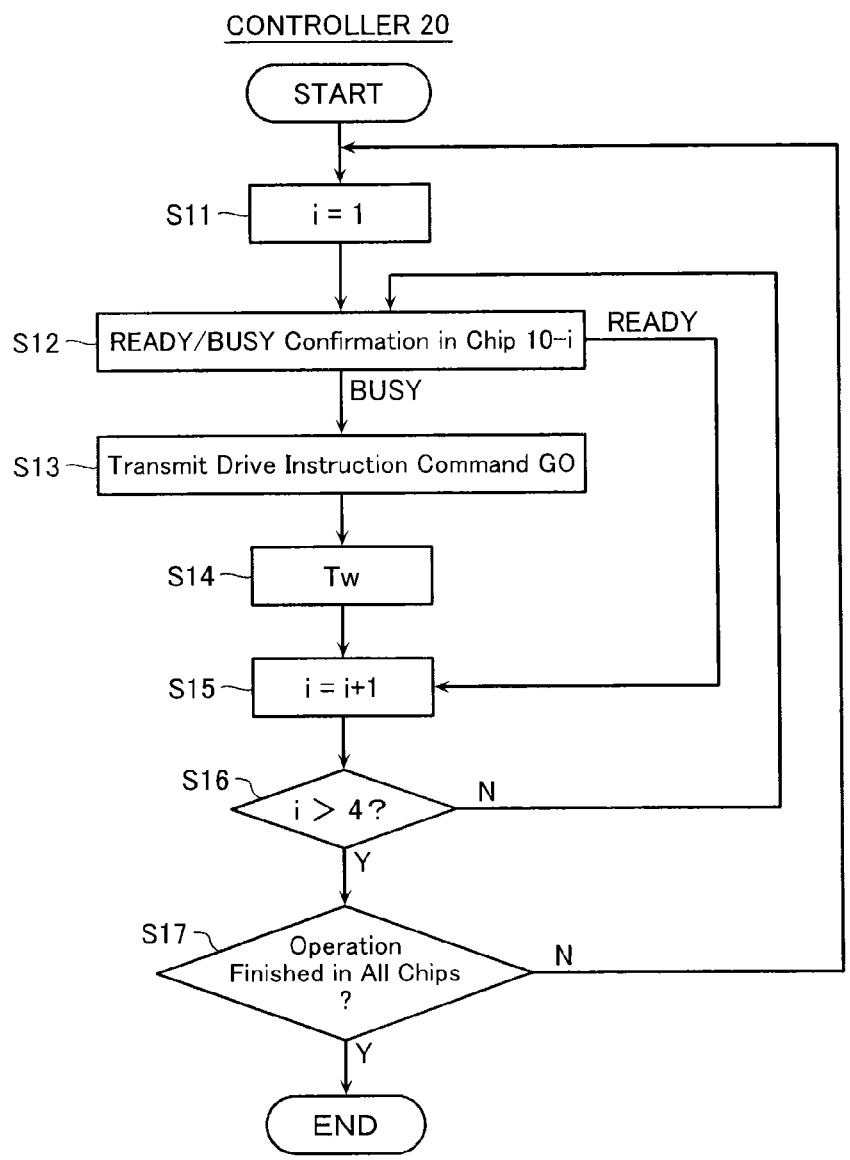
FIGS. 10A and 10B are flowcharts showing an operation in a second embodiment.
Figure 10B:
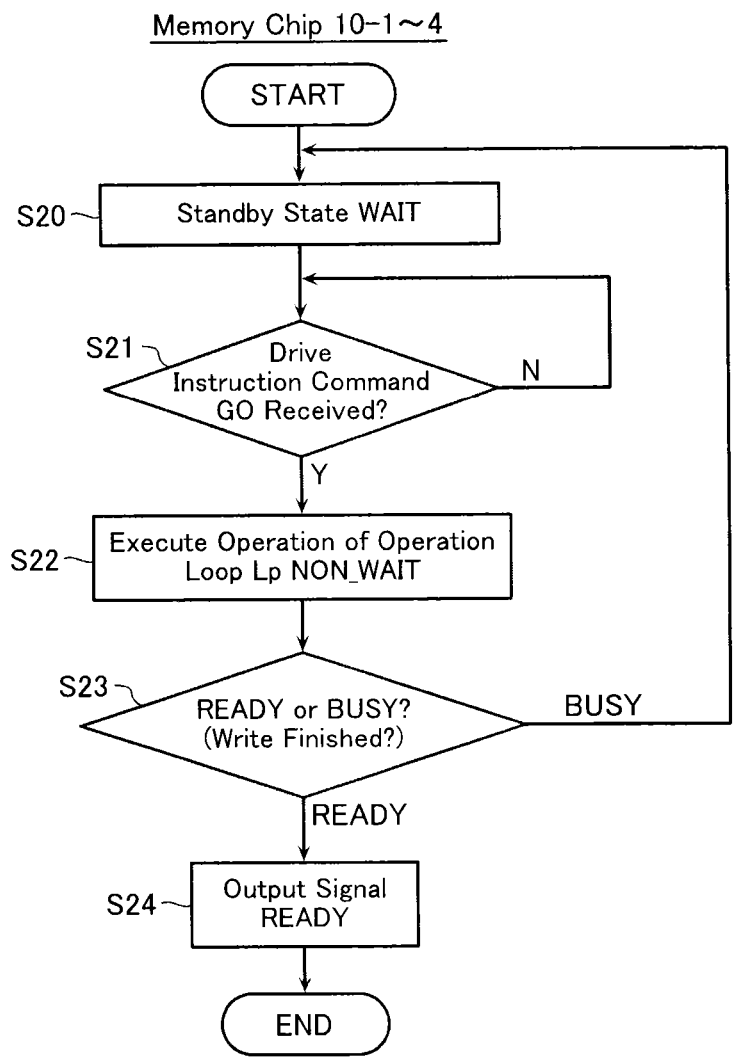
Figure 11:
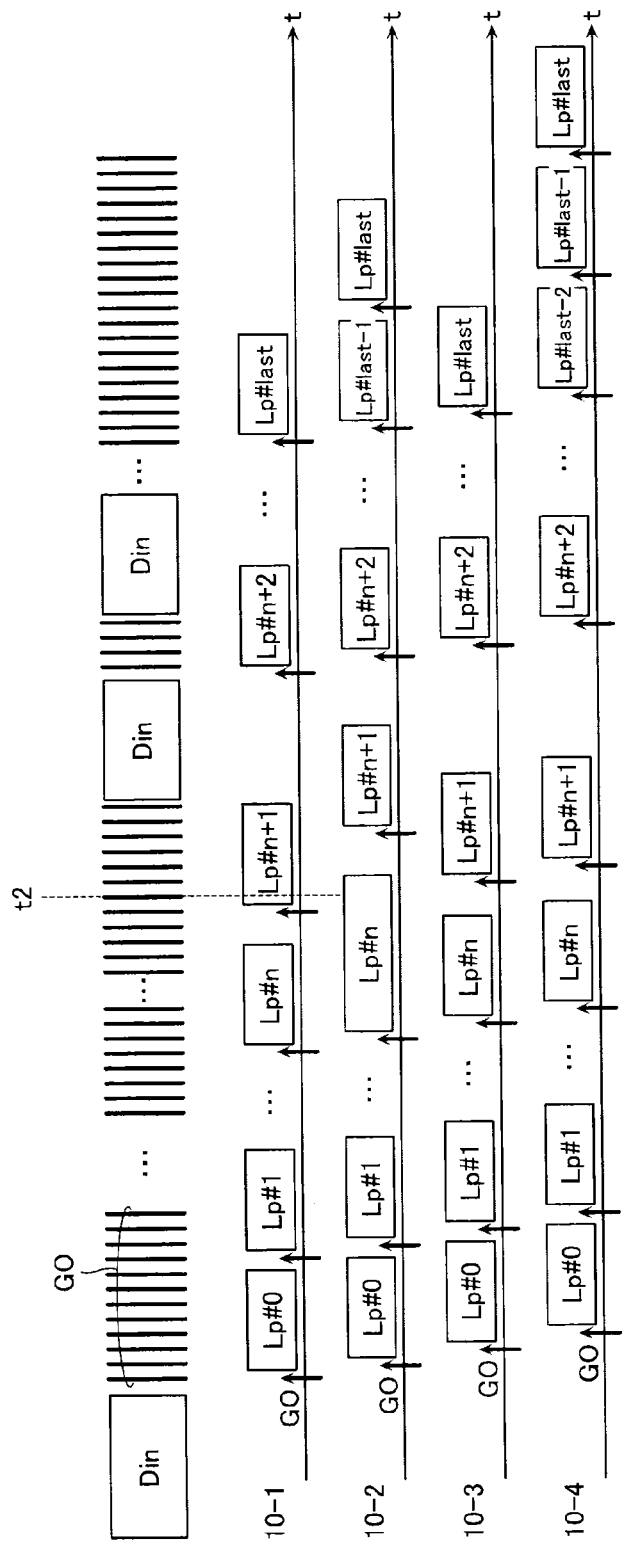
FIG. 11 is a timing chart showing the operation in the second embodiment.

Next, a nonvolatile semiconductor memory device according to a second embodiment will be described with reference to FIGS. 10A, 10B, and 11. A schematic configuration of the device is similar to that of the first embodiment (FIGS. 1-5).

However, the second embodiment differs from the first embodiment in that in this second embodiment, confirmation of READY/BUSY is performed in any of the memory chips 10-1 to 10-4, and, if that memory chip 10-i (i=1 to 4) outputs the signal BUSY, then immediately following this, the drive instruction command GO is transmitted to that memory chip 10-i. For this operation, the controller 20 in this embodiment includes terminals for inputting the signals READY and BUSY, the number of the terminal being the same as that of the memory chips 10-i.

Operation of the nonvolatile semiconductor memory device according to this second embodiment will be described below with reference to FIGS. 10A, 10B, and 11.

Specifically, the controller 20 issues a programming command to each of the memory chips 10-1 to 10-4. After receiving the programming command, each of the memory chips 10-1 to 10-4 performs a prescribed operation and then shifts to the standby state (WAIT) (S20 in FIG. 10B).

The controller 20 confirms first in the memory chip 10-1 whether the programming operation has already finished (READY) or has not been completed (BUSY).

In the case that the programming operation of the memory chip 10-1 has already finished (READY), the memory chip 10-1 outputs the signal READY. The controller 20 does not output the drive instruction command GO to the memory chip 10-1 in response to this signal READY, but performs confirmation of READY/BUSY in the next memory chip 10-2 (S15, N of S16, and S12 in FIG. 10A). On the other hand, if it is confirmed that the programming operation of the memory chip 10-1 has not finished yet (BUSY), then immediately following this, the controller 20 outputs the drive instruction command GO to the memory chip 10-1 (S13). Then, the controller 20 waits for a certain time Tw to elapse (S14), and performs an operation confirming READY/BUSY in the next memory chip 10-2 (S15, N of S16, and S12). Thereafter, a similar procedure is repeated in the memory chips 10-1 to 10-4.

Subsequent operation is similar to that in the first embodiment. Similar advantages to those of the first embodiment may be anticipated also from this second embodiment.

Third Embodiment

Figure 12:
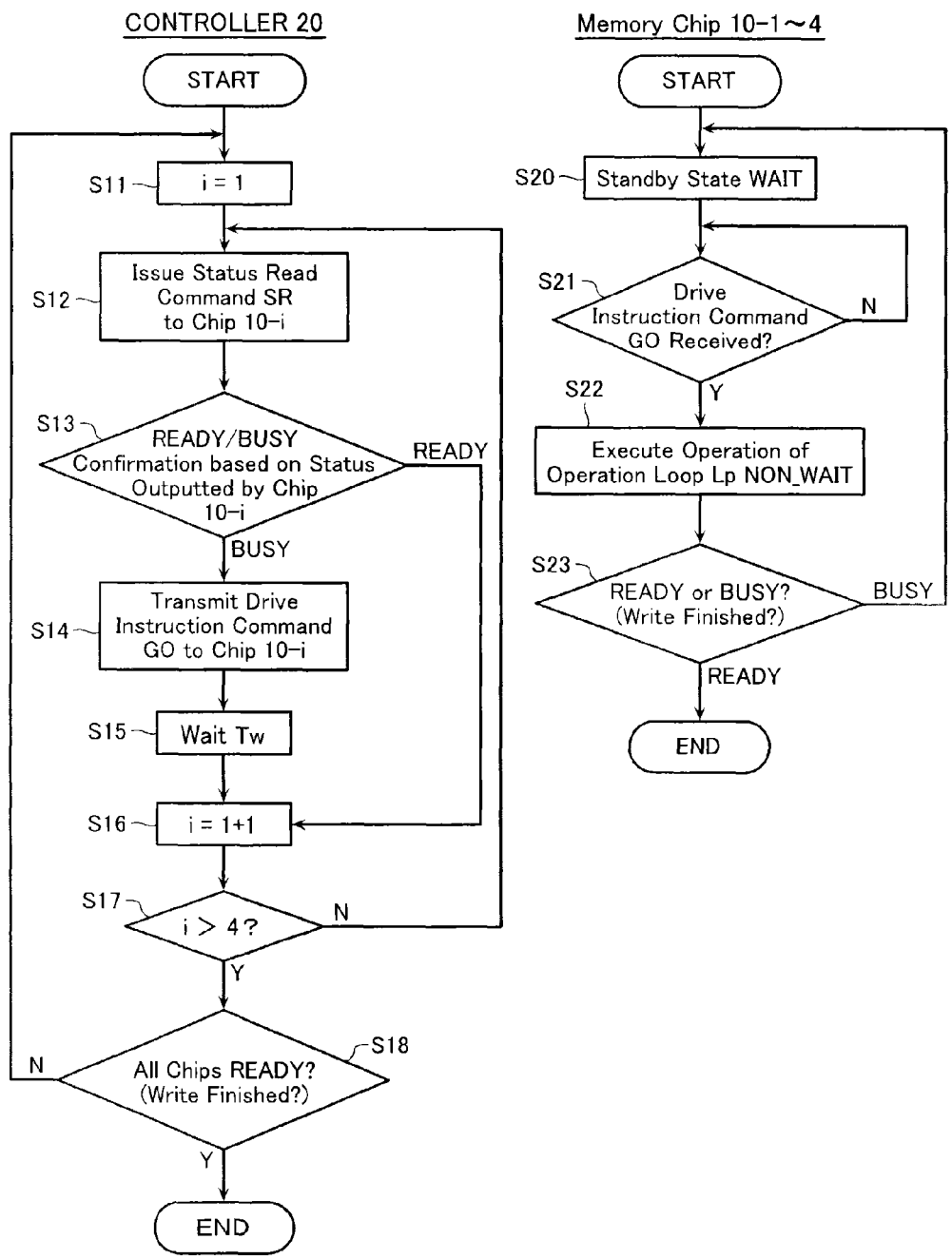
FIG. 12 is a flowchart showing an operation in a third embodiment.
Figure 13:
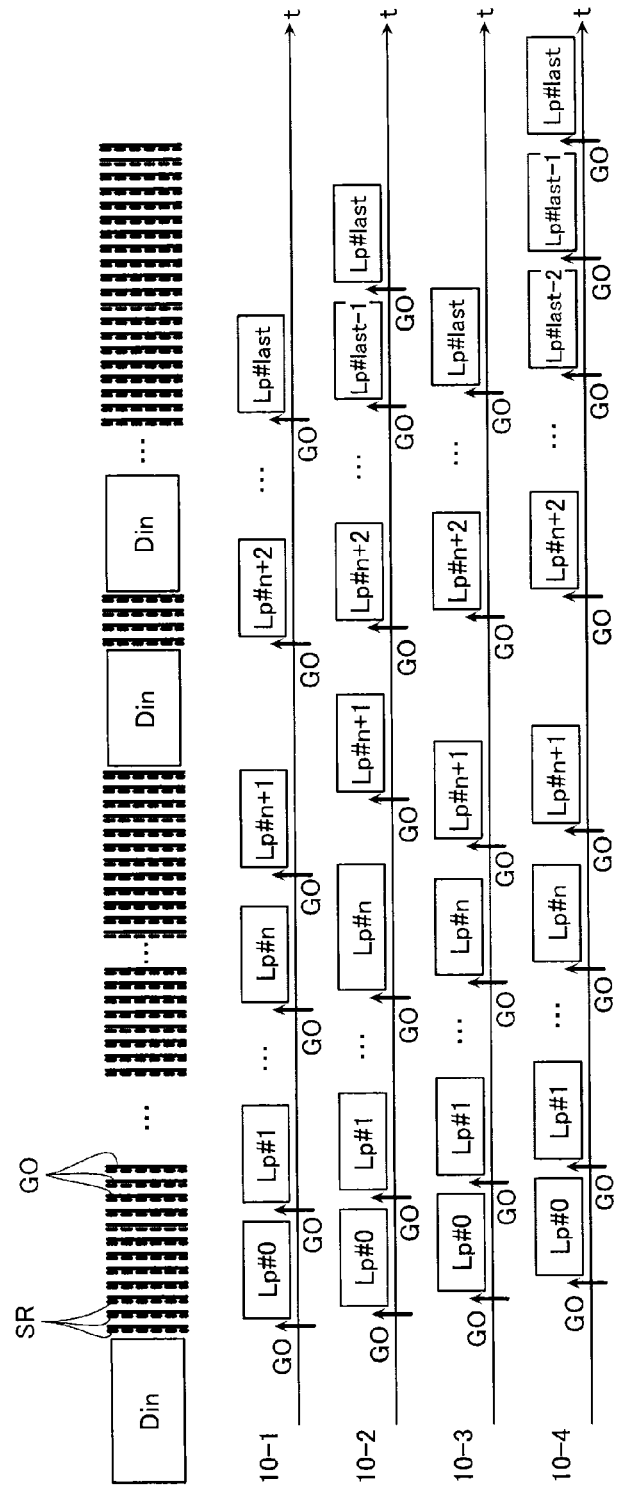
FIG. 13 is a timing chart showing the operation in the third embodiment.

Next, a nonvolatile semiconductor memory device according to a third embodiment will be described with reference to FIGS. 12 and 13. A schematic configuration of the device is similar to that of the first embodiment (FIGS. 1-5).

However, in this third embodiment, in addition to the drive instruction commands GO being transmitted with a certain time interval Tw, a status read command SR for reading a status of the memory chips 10-1 to 10-4 is sent from the controller 20 to any of the memory chips 10-1 to 10-4 (S12 in FIG. 12), and in response to this, the memory chips 10-1 to 10-4 transmit a status signal including the signal READY/BUSY to the controller 20. Moreover, if the memory chip 10-i (i=1 to 4) has outputted the signal BUSY (BUSY of S13), then the drive instruction command GO is transmitted to that memory chip 10-i (S14). Then, after waiting for a certain standby time Tw, the the procedure shifts to next memory chip 10-i+1 (S15 and S16).

On the other hand, if the memory chip 10-i has outputted the signal READY (READY of S13), then the procedure shifts to the next memory chip 10-i+1 without the drive instruction command GO being transmitted to that memory chip 10-i. The above operation is repeated sequentially on all of the memory chips 10-1 to 10-4. Operation in each of the memory chips is substantially identical to that in the second embodiment.

This third embodiment closely resembles the second embodiment in repeating confirmation of READY/BUSY and transmission of the drive instruction command GO in a certain memory chip 10-i. However, this embodiment differs from the second embodiment in having confirmation of READY/BUSY executed in response to the status read command SR. A transmission interval of the status read command SR need only be about the same as that of the drive instruction command GO, hence a situation does not arise that transmission of the status read command and the status signal in response to the status read command occupy the bus between the memory chips and the controller. Therefore, similar advantages to those of the previously described embodiments may be anticipated also from this third embodiment.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of memory chips each including a plurality of memory cells; and
a controller that controls the plurality of memory chips,
the controller being configured to transmit to any of the plurality of memory chips a drive instruction command instructing an operation, the drive instruction command being transmitted sequentially to the plurality of memory chips with at least a first time interval, and
each of the plurality of memory chips being configured to, when the memory chip itself is in a standby state of waiting for an instruction for one operation execution of an operational loop for a certain operation, starts the operation of the operational loop in response to the drive instruction command, while when the memory chip itself is in operation execution of the operational loop, ignores the drive instruction command.

2. The semiconductor memory device according to claim 1, wherein
each of the plurality of memory chips outputs an operation state signal indicating whether the respective memory chip itself has finished the certain operation or not.

3. The semiconductor memory device according to claim 2, wherein
the controller is configured to determine whether the certain operation in each of the plurality of memory chips has finished or not by receiving the operation state signal.

4. The semiconductor memory device according to claim 1, wherein
the controller is configured to transmit a status read command to each of the plurality of memory chips along with the drive instruction command, the status read command requesting transmission of data related to a state of each of the plurality of memory chips.

5. The semiconductor memory device according to claim 1, wherein
the certain operation is a series of operations including repetition of operation of a plurality of operational loops, and
a leading operation of each of the plurality of operational loops is a first operation in which a current value is the largest.

6. The semiconductor memory device according to claim 5, wherein
each of the plurality of memory chips outputs an operation state signal indicating whether the respective memory chip itself has finished the certain operation or not.

7. The semiconductor memory device according to claim 6, wherein
the controller is configured to determine whether the certain operation in each of the plurality of memory chips has finished or not by receiving the operation state signal.

8. The semiconductor memory device according to claim 5, wherein
the controller is configured to transmit a status read signal to each of the plurality of memory chips synchronously with the drive instruction command, the status read signal requesting transmission of data related to a state of each of the plurality of memory chips.

9. A control method of a semiconductor memory device, the semiconductor memory device comprising a plurality of memory chips each including a plurality of memory cells, and a controller that controls the plurality of memory chips, the control method comprising:
transmitting from the controller to any of the plurality of memory chips a drive instruction command instructing an operation, and transmitting the drive instruction command sequentially to the plurality of memory chips with at least a first time interval; and
each of the plurality of memory chips, when the memory chip itself is in a standby state of waiting for an instruction for one operation execution of an operational loop for a certain operation, starting the operation of the operational loop in response to the drive instruction command, while when the memory chip itself is executing the operational loop, ignoring the drive instruction command.

10. The control method of a semiconductor memory device according to claim 9, further comprising:
each of the plurality of memory chips outputting an operation state signal toward the controller, the operation state signal indicating whether the respective memory chip itself has finished the certain operation or not; and
the controller determining whether the operation in each of the plurality of memory chips has finished or not by receiving the operation state signal.

11. The control method of a semiconductor memory device according to claim 9, further comprising:
transmitting a status read command from the controller to each of the plurality of memory chips along with the drive instruction command, the status read command requesting transmission of data related to a state of each of the plurality of memory chips; and
each of the plurality of memory chips transmitting the operation state signal to the controller in response to the status read command.

12. The control method of a semiconductor memory device according to claim 9, wherein
the certain operation is a series of operations including repetition of operation of a plurality of operational loops, and
a leading operation of each of the plurality of operation loops is a first operation in which a current value is the largest.

* * * * *